United States Patent [19]

Nakatsuka et al.

[11] Patent Number: 5,339,458
[45] Date of Patent: Aug. 16, 1994

[54] FREQUENCY CONVERTER UNIT FOR USE IN A HIGH-FREQUENCY RECEIVER

[75] Inventors: Tadayoshi Nakatsuka, Osaka; Hideki Yagita, Hirakata, both of Japan

[73] Assignee: Matsushita Electric Industrial Co., Ltd., Osaka, Japan

[21] Appl. No.: 897,881

[22] Filed: Jun. 12, 1992

[30] Foreign Application Priority Data

Jun. 13, 1991 [JP] Japan .................. 3-141684

[51] Int. Cl.$^5$ .................................................. H04B 1/28
[52] U.S. Cl. ........................... 455/333; 307/529; 328/15
[58] Field of Search ............. 307/529, 271, 491, 304; 328/15, 16; 455/333

[56] References Cited

U.S. PATENT DOCUMENTS

| | | | |
|---|---|---|---|
| 4,829,204 | 5/1989 | Harris, Jr. et al. | 307/529 |
| 4,912,520 | 3/1990 | Yamamoto et al. | 455/333 |
| 5,041,744 | 8/1991 | Sakai et al. | 307/491 |
| 5,083,050 | 1/1992 | Vasile | 455/333 |

FOREIGN PATENT DOCUMENTS

| | | |
|---|---|---|
| 63142908 | 6/1988 | Japan . |
| 63144607 | 6/1988 | Japan . |
| 1101011 | 4/1989 | Japan . |
| 1289304 | 11/1989 | Japan . |

OTHER PUBLICATIONS

S. M. Sze, *Physics of Semiconductor Devices*, Second Edition, John Wiley & Sons, pp. 312–323.

*Primary Examiner*—Reinhard J. Eisenzopf
*Assistant Examiner*—Philip J. Sobutka
*Attorney, Agent, or Firm*—Ratner & Prestia

[57] ABSTRACT

In order to provide a high-gain low-distortion low-consumption-current frequency converter circuit employing an FET and an integrated solid-state unit thereof, an FET type having a large K value and a high gain is used in an oscillator section 180 while another FET type having a small K value and a low distortion is used in an amplifier section 182. The K value of the FET is a parameter measured in microamperes per square volt, expressed in the equation $$Ids = K(Vgs - Vth)^2$$

where Ids represents the drain current of the FET, Vgs represents the voltage across the gate and the source, and Vth represents the threshold level of the FET. The above construction enables forming a high-gain LO section and a low-distortion RF section at the same time thereby to enable integrating a frequency converter circuit having a high gain, a low distortion, and a low consumption current on a semiconductor board.

10 Claims, 6 Drawing Sheets

$$K = 2\frac{\partial gm}{\partial vgs}$$

K value = 200 mA/V²mm

Fig. 2(b)

K value = 150 mA/V²mm

FREQUENCY CONVERTER UNIT FOR USE IN A HIGH-FREQUENCY RECEIVER

BACKGROUND OF THE INVENTION

1. Field of the Invention

The present invention relates to a frequency converter unit, and in particular to a frequency converter unit for use in a high-frequency receiver capable of obtaining a high gain and low distortion with reduction of current consumption employing a field-effect transistor (referred to as "FET" hereinafter).

2. Description of the Prior Art

In recent years, there has been a growing demand for a frequency converter provided at a first stage of a receiver unit capable of low distortion with small consumption of current as channels for broadcasting increases in number with reduction in size and improvement in performance of a high-frequency receiver.

Figure 4:
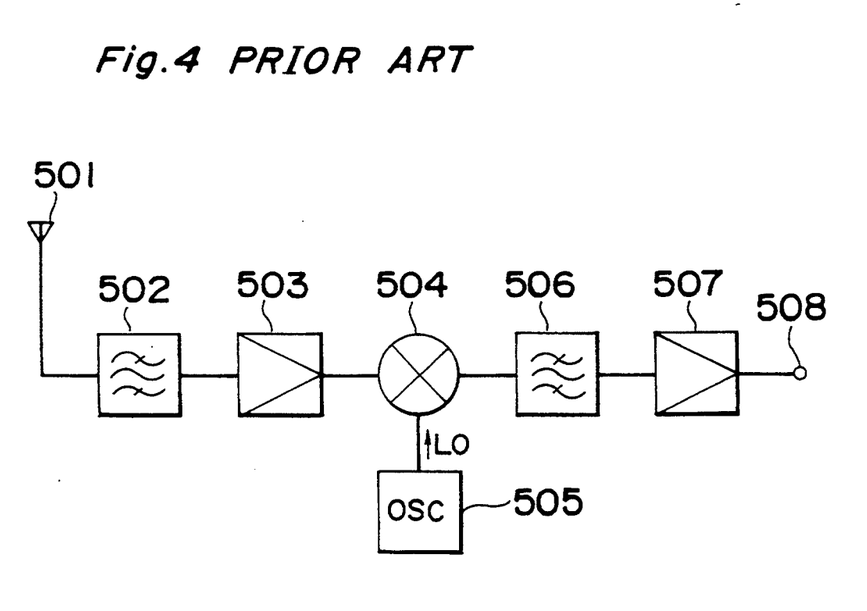
FIG. 4 is a block diagram of a conventional frequency converter.

FIG. 4 shows a block diagram of a conventional high-frequency receiver. Referring to FIG. 4, the receiver is provided with a receiver antenna 501, band-pass filter units 502 and 506, a first-stage amplifier 503, a frequency mixer (referred to as "mixer" hereinafter) 504, an oscillator 505, an amplifier 507, and an intermediate frequency (referred to as "IF" hereinafter) signal output terminal 508.

The following describes the operation of such a conventional high-frequency receiver circuit constructed as mentioned above.

A high-frequency signal received in the receiver antenna 501 is filtered through the band-pass filter 502 to remove frequency components other than a desired frequency component of the input signal and is then amplified by the first-stage amplifier 503 and the amplified signal is entered to the mixer 504. In the mixer 504, the input signal containing a selected frequency component is converted into an IF signal through mixture with a local oscillation (referred to as "LO" hereinafter) signal. The IF signal is then transmitted through the band-pass filter 506 and the IF amplifier 507 to be finally output from the IF signal output terminal 508.

Figure 5:
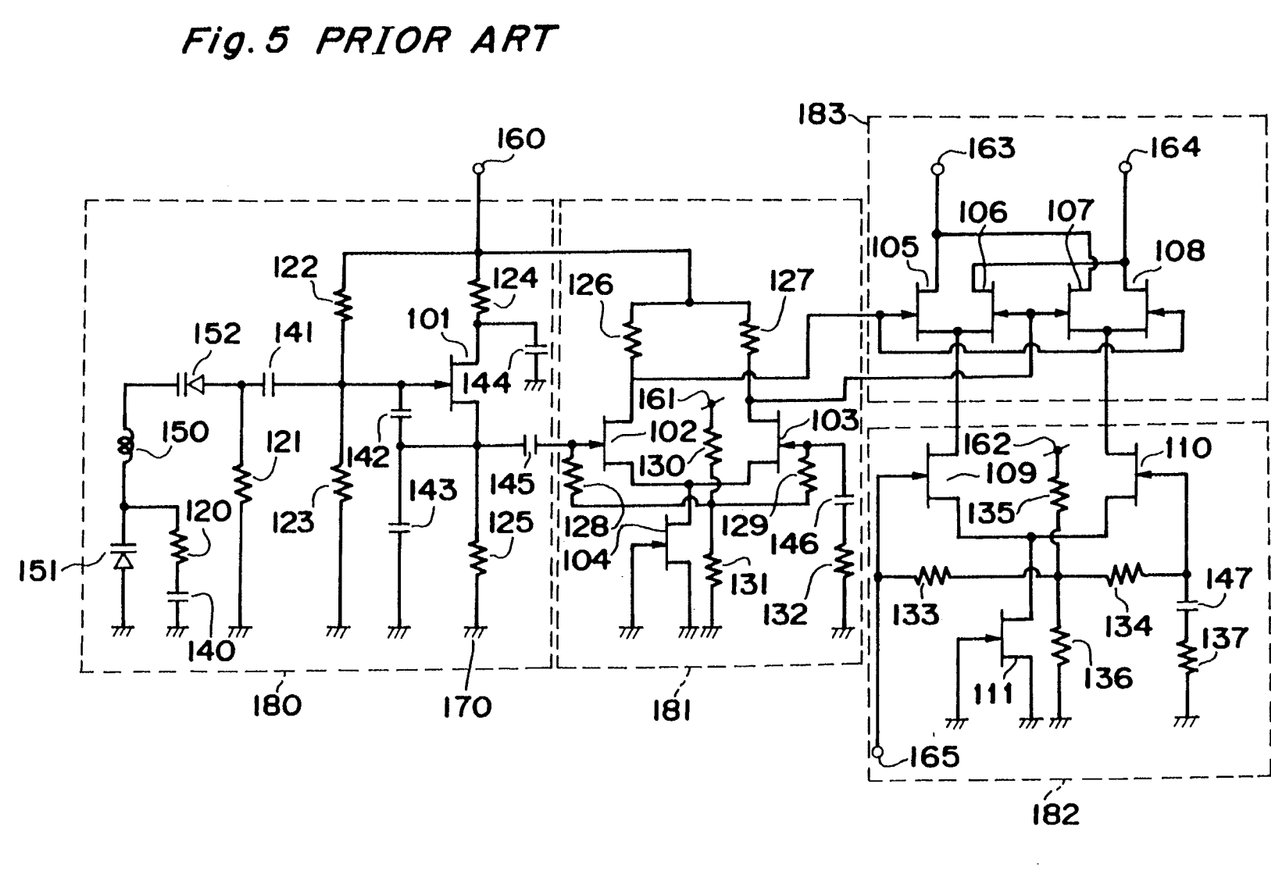
FIG. 5 is a circuit diagram showing an oscillator section and a mixer section of a conventional frequency converter.

FIG. 5 shows a circuit diagram of a conventional frequency converter unit. An oscillator section 180 and an oscillator buffer (referred to as "LO buffer" hereinafter) section 181 in FIG. 5 correspond to the oscillator 505 in FIG. 4, while an amplifier section 182 and a mixer section 183 in FIG. 5 correspond to the mixer 504 in FIG. 4. Referring to FIG. 5, the frequency converter circuit is provided with FETs 101 through 111, resistors 120 through 137, capacitors 140 through 147, an inductor 150, variable-capacity diodes 151 and 152, power terminals 160 through 162, IF signal output terminals 163 and 164, an RF signal input terminal 165, and grounding 170.

The following describes the operations of the frequency converter circuit having such components as mentioned above.

The oscillator section 180 oscillates at a resonance frequency of a resonance circuit composed of the variable-capacity diodes 151 and 152 and the inductor 150 and generates an LO signal to be transmitted to the LO buffer section 181. The LO buffer section 181 is provided with a differential amplifier for stabilizing the oscillator section 180 and for generating a balanced signal. The LO signal output from the oscillator section 180 is applied to a gate terminal of the FET 102 constituting a differential pair in the LO buffer section 181.

The input LO signal is converted into a balanced LO signal including a phase difference in the LO buffer section 181 so as to be transmitted to the mixer section 183. In the meantime, an RF signal input to a gate terminal (i.e., the RF signal input terminal 165) of the FET 109 constituting the differential pair of the amplifier section 182 is converted into a balanced RF signal in the amplifier section 182. The balanced RF signal output from the amplifier section 182 is entered to the mixer section 183. The balanced LO signal and the balanced RF signal are subject to frequency conversion in the mixer section 183 so as to form a balanced IF signal. The balanced IF signal containing the sum and difference in frequency of the balanced LO and RF signals is output from the IF signal output terminals 163 and 164. As a type of the mixer, there is used a double-balanced mixer having an improved secondary distortion characteristic preventing the LO signal from leaking to the RF terminal. The balanced IF signal output from the mixer 183 is converted into an unbalanced IF signal through synthesizing both the signals in a subsequent balanced-to-unbalanced signal converter and the unbalanced IF signal is then transmitted to an IF signal processing section.

The above-mentioned high-frequency receiver is required to have a high gain performance, low distortion characteristic, and a small consumption of current. Among those factors, the gain depends on the K value and the mutual conductance gm of the FET used in the circuit, while the distortion characteristic depends on the linearity of the input-output characteristic of the FET. In other words, the greater the K value and gm of the FET are, the higher the gain results. While the better the linearity is, the less the distortion results. The drain current (Ids) of the FET can be expressed approximately as follows.

$$Ids = K(Vgs - Vth)^2 \qquad (1)$$

where Vgs represents the voltage across the gate and the source, Vth represents the threshold level of the FET, K represents a parameter measured in microamperes per square volt of the FET. In the equation (1), gm can be derived by differentiating both the members by Vgs as follows.

$$gm = 2K(Vgs - Vth) \qquad (2)$$

As obvious from the equation (2), gm is proportional to the K value and Vgs. However, in general, in order to increase the K value of the FET formed through a selective ion incorporation, the threshold level Vth is required to be shallow, resulting in that the input-output linearity is deteriorated so that the distortion characteristic conversely degrade. In order to improve the input-output linearity, the K value is required to be small to moderate the gm characteristic with respect to Vgs in the vicinity of the operating point, which results in increasing the absolute value of the threshold voltage Vth to increase the consumption current.

Figure 6:
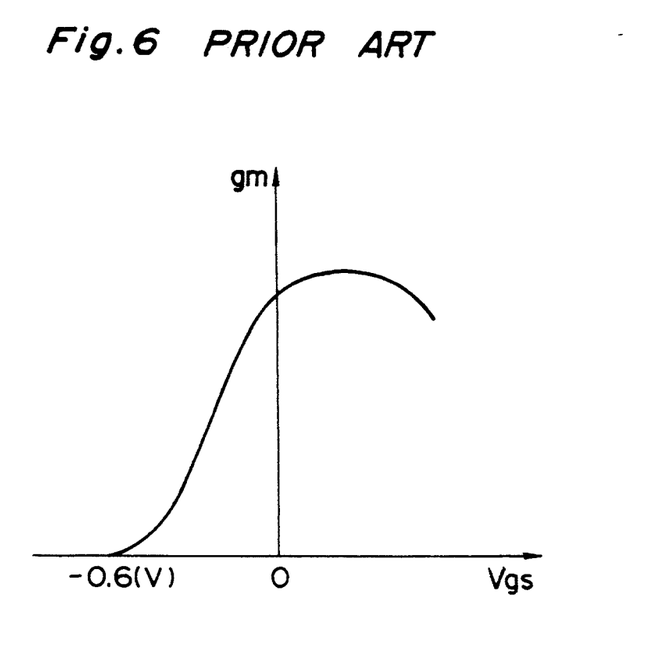
FIG. 6 is a graph diagram showing a gm-Vgs characteristic of an FET employed in a conventional frequency converter.

As obvious from the above facts, there is a reciprocality between the gain and the distortion characteristic, and there is also a reciprocality between the distortion characteristic and the consumption current. Therefore, when designing a circuit employing FETs having the same characteristic, it is compelled to select a reasonable point compromising between those characteristics. In the conventional example in FIG. 5, an FET having a characteristic as shown in FIG. 6 is employed. The FET having the characteristic in FIG. 6 has a K value of 170 mA/V$^2$. mm, a threshold voltage of $-0.6$ V, and a mutual conductance gm of 160 mS/mm.

However, in the conventional circuit construction as mentioned above, for the reason that FETs having the same characteristic have been employed in the oscillator section and in the amplifier section, there has been a problem that the distortion characteristic of the amplifier section deteriorates when an FET having a large K value is used making great account of oscillator output, or otherwise the consumption current increases and the oscillator output reduces when an FET having a small K value and a large threshold voltage is used making great account of the distortion characteristic of the amplifier section.

SUMMARY OF THE INVENTION

Accordingly, an essential object of the present invention is to solve the problem mentioned above and to provide a frequency converter unit having a high gain and low distortion with reduction of current consumption employing an FET and an integrated solid-state unit thereof.

In order to attain the object mentioned above, the frequency converter unit of the present invention is provided with solid-state units, wherein oscillator means (180, 181) is provided with FETs each having a large K value and a small threshold voltage while mixer means (182, 183) is provided with FETs each having a small K value and a large threshold voltage, wherein the K value of the FET used in the oscillator means is more than 20 percent greater than that used in the mixer means while the absolute value of the threshold voltage of the FET used in the mixer means is more than 20 percent greater than that used in the oscillator means.

With the construction as described above, an FET having a larger K value and a small threshold voltage can be used in each of the oscillator section while an FET having a small K value and a large threshold voltage can be used in the amplifier section. The above-mentioned construction enables obtaining a high gain without increasing the consumption current through the oscillator section while suppressing an occurrence of distortion in the amplifier section, which enables providing a frequency converter circuit having a high gain and a low distortion with low current consumption.

BRIEF DESCRIPTION OF THE DRAWINGS

These and other objects and features of the present invention will become apparent from the following description taken in conjunction with the preferred embodiments thereof with reference to the accompanying drawings, in which:

FIG. 2 (a) is a graph diagram showing a gm-Vgs characteristic of an FET for use in each of an oscillator of a high-frequency receiver in accordance with the present invention;

FIG. 2 (b) is a graph diagram showing a gm-Vgs characteristic of an FET for use in each of an amplifier of a high-frequency receiver in accordance with the present invention;

DETAILED DESCRIPTION OF THE PREFERRED EMBODIMENTS

Before the description proceeds, it is noted that since the basic structure of the high-frequency converter of the present invention is similar to that of the conventional one, like parts are designated by the same reference numerals throughout the drawings.

EXAMPLE 1

Figure 1:
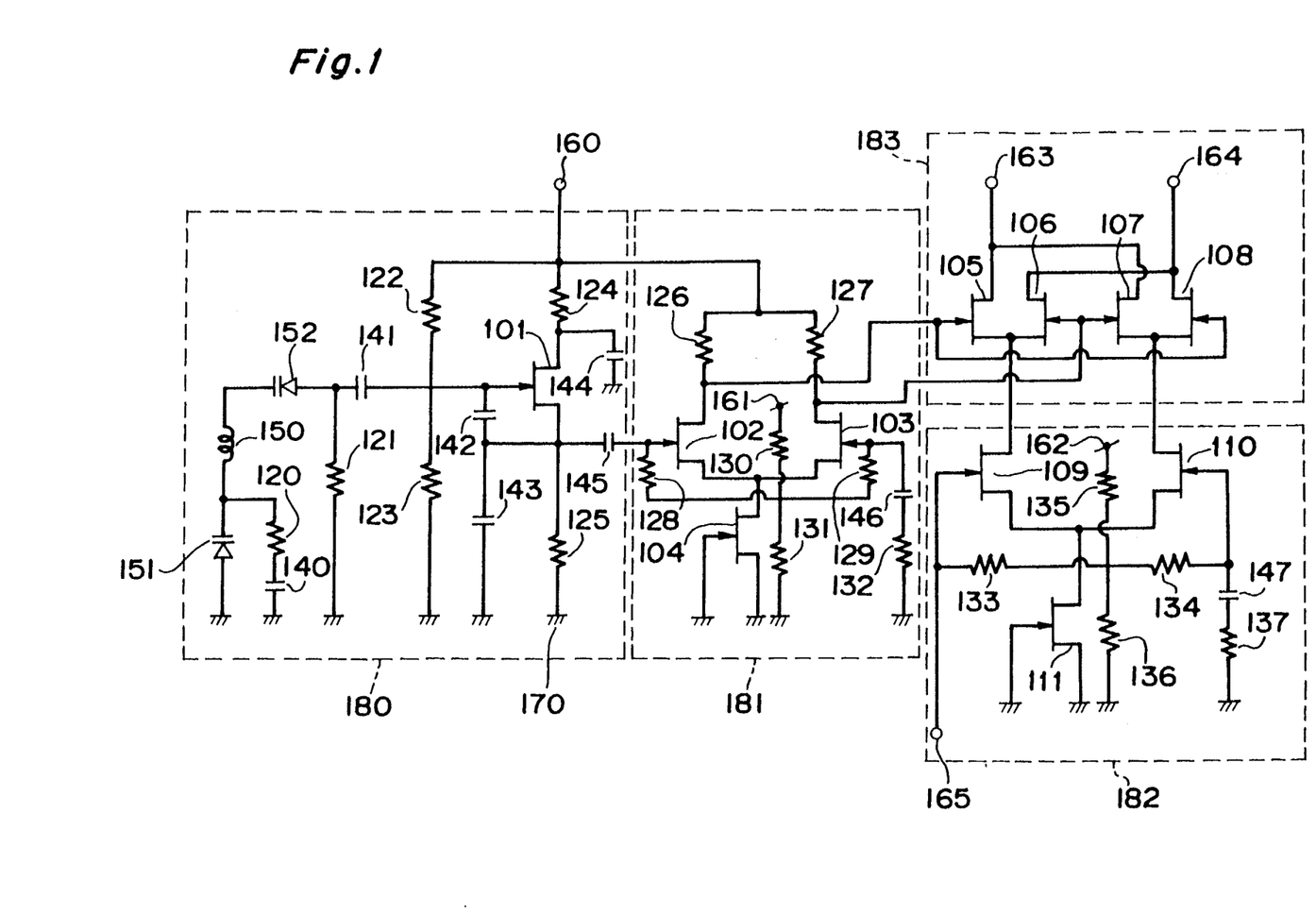
FIG. 1 is a circuit diagram of a frequency converter in accordance with a first embodiment of the present invention.

FIG. 1 shows a first embodiment of a frequency converter unit according to the present invention. Referring to FIG. 1, the frequency converter unit is provided with FETs 101 through 111, resistors 120 through 137, capacitors 140 through 147, an inductor 150, variable-capacity diodes 151 and 152, power terminals 160 through 162, IF signal output terminals 163 and 164, an RF signal input terminal 165, grounding 170, an oscillator section 180, an LO buffer section 181, an amplifier section 182, and a mixer section 183.

The following describes the operation of the first embodiment having the above-mentioned components.

Figure 2A:
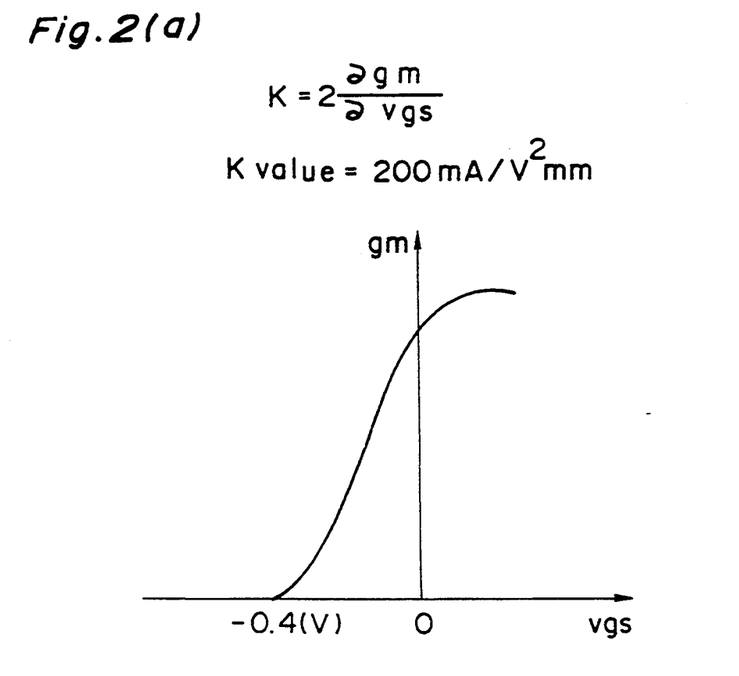

There are used FETs each having a characteristic shown in FIG. 2 (a) as the FET 101 in the oscillator and as the FETs 102 through 104 in the LO buffer. The FET having the characteristic in FIG. 2 (a) has a K value of 200 mA/V$^2$. mm, a threshold voltage of $-0.4$ V, and a mutual conductance gm of 180 mS/mm so that the circuit construction of the oscillator and LO buffer sections 180 and 181 has a high gain.

Figure 2B:
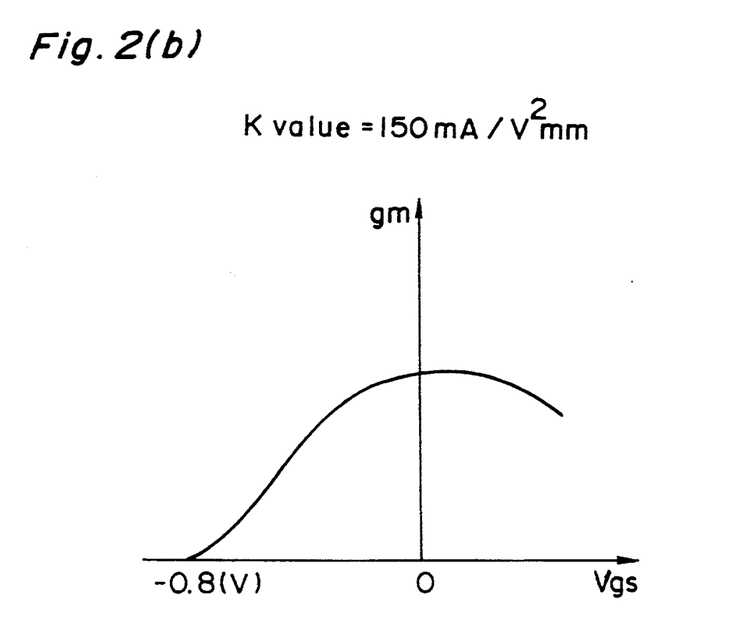

On the other hand, there are used FETs each having a characteristic shown in FIG. 2 (b) as the FETs 109 through 111 in the amplifier section 182 and as the FETs 105 through 108 in the mixer section 183. The FET having the characteristic in FIG. 2 (b) has a K value of 150 mA/V$^2$. mm, a threshold voltage of $-0.8$ V, and a mutual conductance gm of 140 mS/mm so that the circuit construction of the amplifier and mixer sections 182 and 183 has an improved low distortion characteristic. With the circuit construction as mentioned above, each of the oscillator and the LO buffer sections 180 and 181 can obtain a low consumption current and a high gain characteristic, while each of the amplifier and mixer sections 182 and 183 can obtain a characteristic of low distortion. Eventually, there can be obtained a frequency converter circuit exhibiting an improvement by 5 dB in secondary intermodulation distortion and a consumption current reduction by 10 mA as compared with a high-frequency receiver circuit having a conventional construction.

Although, in this embodiment, the values of K, threshold voltages and gm are set as mentioned above, the present invention is not limited to these values, and these values may be selected in such a range that the FET type used in the oscillator and LO buffer sections has a K value at least 20 percent greater than that of a FET used in the amplifier and mixer sections. It is also preferable that the absolute value of the threshold voltage of the FET type used in the amplifier and mixer sections is set at least 20 percent greater than that of the FET type used in the oscillator and LO buffer sections.

EXAMPLE 2

Figure 3:
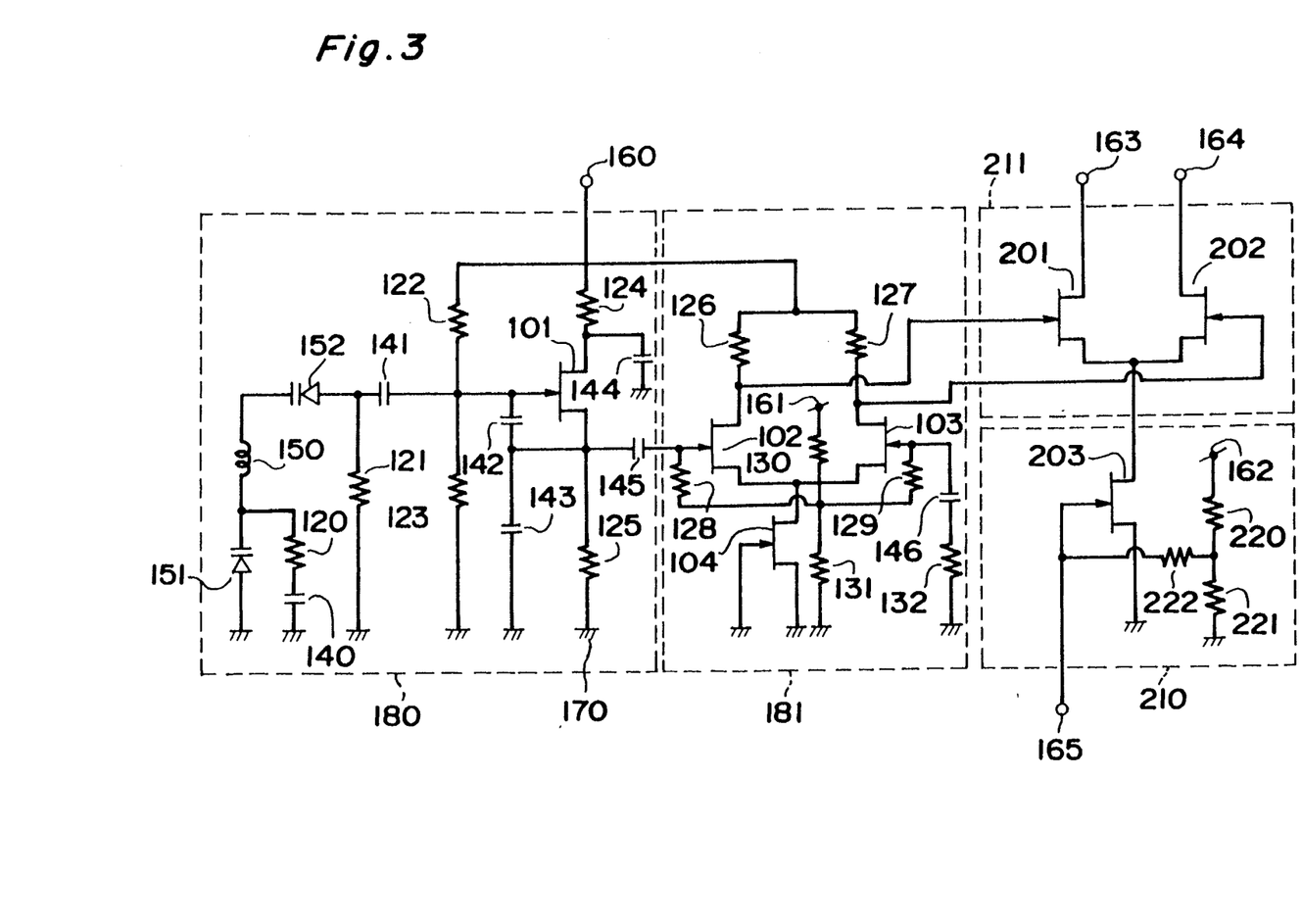
FIG. 3 is a circuit diagram of a frequency converter in accordance with a second embodiment of the present invention.

FIG. 3 shows a second embodiment of a frequency converter circuit according to the present invention. Referring to FIG. 3, the frequency converter circuit is provided with FETs 101 through 104 and 201 through 203, resistors 120 through 132 and 220 through 222, capacitors 140 through 146, an inductor 150, variable-capacity diodes 151 and 152, power terminals 160 through 162, IF signal output terminals 163 and 164, an RF signal input terminal 165, grounding 170, an oscillator section 180, an LO buffer section 181, an amplifier section 210, and a mixer section 211.

The following describes the operation of the second embodiment having the above-mentioned components.

The point that the second embodiment differs from the first embodiment is that a single balanced mixer is used in the mixer section 211 while a discrete FET is used in the amplifier section 210. With the above construction, the amount of consumption current in the mixer section 211 and the amplifier section 210 can be reduced to one-half of the corresponding consumption current in the first embodiment thereby to enable achieving a lower consumption current.

Table 1 shows a list of characteristics of the frequency converter circuits in accordance with the first and second embodiment of the present invention as compared with the conventional example.

TABLE 1

|  | Conventional | Embodiment 1 | Embodiment 2 |
| --- | --- | --- | --- |
| Conversion gain | −1 dB | +1 dB | +1 dB |
| Noise index | 11 dB | 10 dB | 10 dB |
| 1% intermodulation | 98 dBμ | 104 dBμ | 104 dBμ |
| Idd | 68 mA | 58 mA | 44 mA |

According to Table 1, the construction of the present invention is superior to the conventional example by 2 dB in conversion gain, 1 dB in noise index, 6 dBμ in 1% intermodulation distortion as well as a reduction of not less than 10 mA in Idd.

Moreover, in this second embodiment, similarly to the first embodiment, the K values and threshold voltages of FETs are not limited to these values, and it is preferable that the K value of the FET type used in the oscillator and LO buffer sections is set at least 20 percent greater than that of the FET type used in the amplifier and mixer sections. It is also preferable that the absolute value of the threshold voltage of the FET type used in the amplifier and mixer sections is set at least 20 percent greater than that of the FET type used in the oscillator and LO buffer sections.

As described above, the K value of the FET used in the oscillator section is set at least 20 percent greater than that used in the amplifier section while the absolute value of the threshold voltage of the FET used in the amplifier section is set at least 20 percent greater than that used in the oscillator section.

The above-mentioned construction enables obtaining a high gain without increasing the consumption current through the oscillator section, suppressing an occurrence of distortion in the amplifier section, which enables providing a frequency converter unit having a high gain and a low distortion with low current consumption.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A frequency converter unit comprising:
oscillator means which is provided with a type of FETs each having a large K value and a high gain, where K is a parameter measured in microamperes per square volt, expressed in the equation $$Ids = K(Vgs - Vth)^2$$

where Ids represents the drain current of the FET, Vgs represents the voltage across the gate and the source, and Vth represents the threshold level of the FET; and
frequency mixer means which is provided with another type of FETs each having a small K value; wherein the K value of each of the FETs employed in said oscillator means is set at least 20 percent greater than the K value of each of the FETs employed in said frequency mixer means.

2. A frequency converter unit comprising:
oscillator means which is provided with a type of FETs each having a small threshold voltage; and
frequency mixer means which is provided with another type of FETs each having a large threshold voltage; wherein the absolute value of the threshold voltage of each of the FETs employed in said frequency mixer means is set at least 20 percent greater than the absolute value of the threshold voltage of each of the FETs employed in said oscillator means.

3. The frequency converter unit as claimed in claim 1 or 2, wherein said oscillator means consists of an oscillator section and an oscillator buffer section while said frequency mixer means consists of an amplifier section and a frequency mixer section.

4. The frequency converter unit as claimed in claim 3, wherein a double-balanced mixer having an improved secondary distortion characteristic is used in the frequency mixer section.

5. A frequency converter unit comprising:
oscillator means which is provided with a type of FETs each having a large K value and a high gain, and having a small threshold voltage, where K is a parameter measured in microamperes per square volt, expressed in the equation $$Ids = K(Vgs - Vth)^2$$

where Ids represents the drain current of the FET, Vgs represents the voltage across the gate and the source, and Vth represents the threshold level of the FET; and
frequency mixer means which is provided with another type of FETs each having a small K value and having a large threshold voltage; wherein the K value of each of the FETs employed in said oscillator means is set at least 20 percent greater than the K value of each of the FETs employed in said frequency mixer means, and wherein the absolute value of the threshold voltage of each of the FETs employed in said frequency mixer means is set at least 20 percent greater than the absolute value of the threshold voltage of each of the FETs employed in said oscillator means.

6. The frequency converter unit as claimed in claim 5, wherein said oscillator means consists of an oscillator section and an oscillator buffer section while said frequency mixer means consists of an amplifier section and a frequency mixer section.

7. The frequency converter unit as claimed in claim 5, wherein in said mixer means, input signal containing a selected frequency component is converted into an intermediate frequency (IF) signal through mixture with a local oscillation (LO) signal transmitted from said oscillator means.

8. The frequency converter unit as claimed in claim 7, wherein the input local oscillation (LO) signal is converted into a balanced local oscillation (LO) signal including a phase difference in the oscillator buffer section so as to be transmitted to the frequency mixer section.

9. The frequency converter unit as claimed in claim 8, wherein an amplifier section converts an input RF signal into a balanced RF signal to be transmitted to said mixer section, whereby the balanced LO signal and the balanced RF signal are subject to frequency conversion in the mixer section so as to form a balanced IF signal containing the sum and difference in frequency of the balanced LO and RF signals is output from said mixer section.

10. The frequency converter unit as claimed in claim 6, wherein a single balanced mixer is used in said frequency mixer section while a discrete FET is used in said amplifier section.

* * * * *